United States Patent
Tsai et al.

(10) Patent No.: US 8,124,886 B2
(45) Date of Patent: Feb. 28, 2012

(54) MEMBRANE CIRCUIT BOARD

(75) Inventors: Wen-Yu Tsai, Dacheng Township, Changhua County (TW); Lei-Lung Tsai, Sinjhuang (TW)

(73) Assignee: Darfon Electronics Corp., Gueishan, Taoyuan (TW)

( * ) Notice: Subject to any disclaimer, the term of this patent is extended or adjusted under 35 U.S.C. 154(b) by 267 days.

(21) Appl. No.: 12/610,434

(22) Filed: Nov. 2, 2009

(65) Prior Publication Data

US 2010/0108360 A1    May 6, 2010

(30) Foreign Application Priority Data

Nov. 5, 2008 (TW) ................. 97219811 U

(51) Int. Cl.
*H05K 1/00* (2006.01)
*H01H 13/76* (2006.01)
*G06F 3/02* (2006.01)

(52) U.S. Cl. ........ 174/268; 174/250; 174/254; 174/267; 361/760; 361/762; 200/5 A; 200/512; 200/600

(58) Field of Classification Search .......... 174/254–267, 174/72 TR; 361/748–750, 753, 760–764, 361/776–778, 781, 789, 791, 799, 822, 823, 361/832; 200/5 A, 5 R, 181, 292, 344, 512–517, 200/600; 257/678, 691, 686, 694–698; 29/450, 29/592.1, 600, 622, 825–852; 341/20, 22–35

See application file for complete search history.

(56) References Cited

U.S. PATENT DOCUMENTS

| | | | | |
|---|---|---|---|---|
| 4,127,740 A * | 11/1978 | LaMarche | ...................... | 174/254 |
| 4,400,758 A * | 8/1983 | Frame | ........................... | 200/600 |
| 4,425,484 A * | 1/1984 | Fukukura | ...................... | 200/5 A |
| 4,451,714 A * | 5/1984 | Eventoff | ....................... | 200/5 A |
| 4,488,016 A * | 12/1984 | Fukukura | ...................... | 200/5 A |
| 4,493,952 A * | 1/1985 | Kaleida | ......................... | 200/5 A |
| 4,562,315 A * | 12/1985 | Aufderheide | ................. | 200/5 A |
| 4,623,768 A * | 11/1986 | Gnant | ........................... | 200/512 |
| 4,795,861 A * | 1/1989 | O'Rourke | ...................... | 200/5 A |
| 4,857,683 A * | 8/1989 | Maser | ........................... | 200/5 A |
| 4,857,684 A * | 8/1989 | Gratke | ........................... | 200/600 |
| 4,920,342 A * | 4/1990 | Gratke | ........................... | 341/22 |
| 5,276,418 A * | 1/1994 | Klosowiak et al. | ........... | 335/202 |
| 6,072,126 A * | 6/2000 | Shiga et al. | ................... | 174/250 |
| 6,166,342 A * | 12/2000 | Chou | ........................... | 200/344 |
| 6,323,445 B1 * | 11/2001 | Yee | ............................... | 200/5 A |
| 6,810,579 B2 * | 11/2004 | Lu | ................................... | 29/622 |
| 6,874,959 B2 * | 4/2005 | Takahashi | ..................... | 400/472 |
| 6,917,000 B2 * | 7/2005 | Yen | ............................... | 200/5 A |
| 6,943,705 B1 * | 9/2005 | Bolender et al. | ................ | 341/33 |
| 2008/0230362 A1 * | 9/2008 | Hsu | ............................... | 200/512 |

* cited by examiner

*Primary Examiner* — Michail V Datskovskiy
(74) *Attorney, Agent, or Firm* — Winston Hsu; Scott Margo

(57) ABSTRACT

The invention discloses a membrane circuit board including a substrate, a plurality of first signal pins and a second signal pin. The first signal pins and the second signal pin are disposed on the substrate. The substrate has a first edge. Each of the first signal pins has a first terminal, and the first terminal has a first width. The second signal pin has a second terminal, which is disposed between the first edge and the first terminal. The second terminal has a second width. The second width is larger than the first width. Accordingly, the membrane circuit board may have high error tolerance and better quality control efficiency.

6 Claims, 3 Drawing Sheets

MEMBRANE CIRCUIT BOARD

BACKGROUND OF THE INVENTION

1. Field of the Invention

The invention relates to a membrane circuit board and, more particularly, to a membrane circuit board with high error tolerance and better quality control efficiency.

2. Description of the Prior Art

Recently, various integrated circuits (ICs) are widely applied in all kinds of applications, e.g. computer, PDA or smart phone, etc. The membrane circuit board is one of the common integrated circuit structures. One membrane circuit board may consist of substrate, active components and passive components. The substrate is usually made of insulation material, e.g. glass or porcelain. The active components (e.g. transistor or diode) and the passive components (e.g. resistor or capacitor) are formed onto the substrate by various processes, for example, vacuum evaporation process, sputtering process, silk screening process and metallization process.

A traditional membrane keyboard in prior art includes a substrate, an upper cover attached on the substrate and a membrane circuit board. The membrane circuit board is disposed between the upper cover and the substrate for sensing the electronic signals while users are typing on the keyboard.

Please refer to FIG. 1. FIG. 1 is a schematic diagram illustrating a membrane circuit board 1 in prior art. As shown in FIG. 1, the membrane circuit board 1 includes a substrate 10 and a plurality of signal pins 12. The signal pins 12 have terminals 120 with one identical width. The terminals of the signal pins 12 are coupled with an external electronic device (e.g. personal computer, laptop computer, mobile phone or PDA) for transmitting the electronic signals (typing input) to the external electronic device.

However, the signal pins of the membrane circuit board may have some mismatch or defect problem because mold injection process in forming the signal pins. Besides, the signal pins are arranged in a compact space, such that a defective product can not be distinguished from normal ones by human eyes of an Input Quality Control (IQC) person. Especially, when the defects happens on the power-controlling signal pin (which is usually the first or the last pin of these signal pins) of the membrane circuit board, it might cause the external electronic device not response to the turn-on request from users. In this case, it is hard for users or producers to confirm or examine the real bug or fault cause on the electronic device, which is not even power-on.

The invention discloses a membrane circuit board with high error tolerance and better quality control efficiency, so as to solve aforesaid problems.

SUMMARY OF THE INVENTION

A scope of the invention is to provide a membrane circuit board. The membrane circuit board may have a higher error tolerance to the production mismatch, and the quality of the membrane circuit board is easy to be verified by Input Quality Control (IQC).

According to an embodiment, the membrane circuit board of the invention includes a substrate, a plurality of first signal pins and a second signal pin. The first and the second signal pins are disposed on the substrate.

The substrate has a first edge. Each of the first signal pins has a first terminal with a first width. The second signal pin has a second terminal with a second width. The second terminal is disposed between the first edge and the first signal pins. The second width is larger than the first width. Besides, there is a first gap between the second terminal and the first edge, and the first gap is equal to a first standard tolerance.

On the membrane circuit board of the invention, the second signal pin has wider terminal compared to the first signal pins. Therefore, when the membrane circuit board is linked to an external electronic device, the second signal pin with wider terminal may provide a better connection. In this way, may allow a higher error tolerance in the production process of the membrane circuit board. Besides, the first gap between the second terminal the first edge is smaller than a traditional circuit board, e.g. the gap can be equal to one standard tolerance unit. If there is a mismatch happened during the punching process, the second signal pin will be cut or trimmed, such that the first gap will disappear. In this case, the disappearance of the first gap can be identified by human eyes easily, such that the quality control of the membrane circuit board can be more effective.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
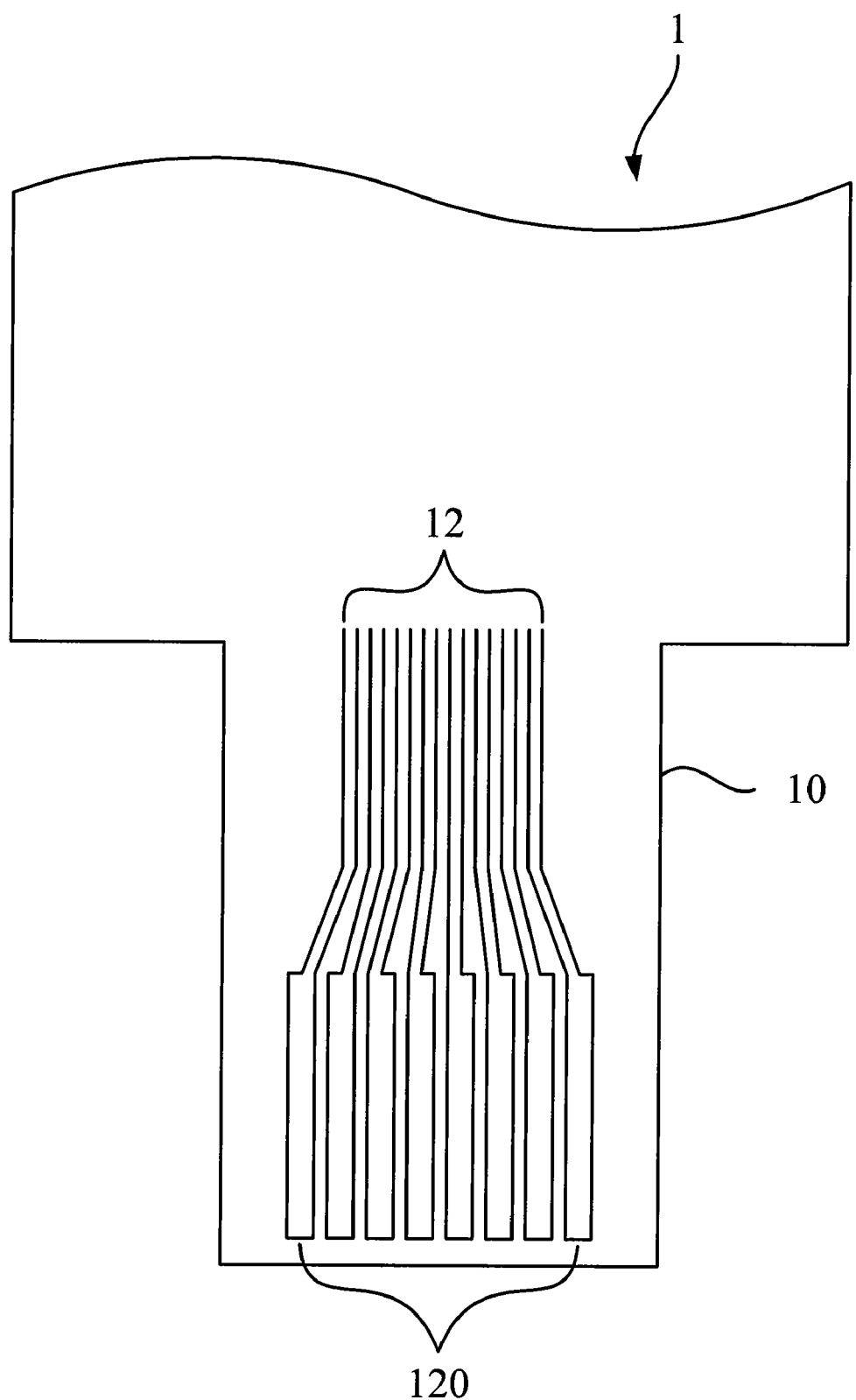
FIG. 1 is a schematic diagram illustrating a membrane circuit board in prior art.
Figure 2:
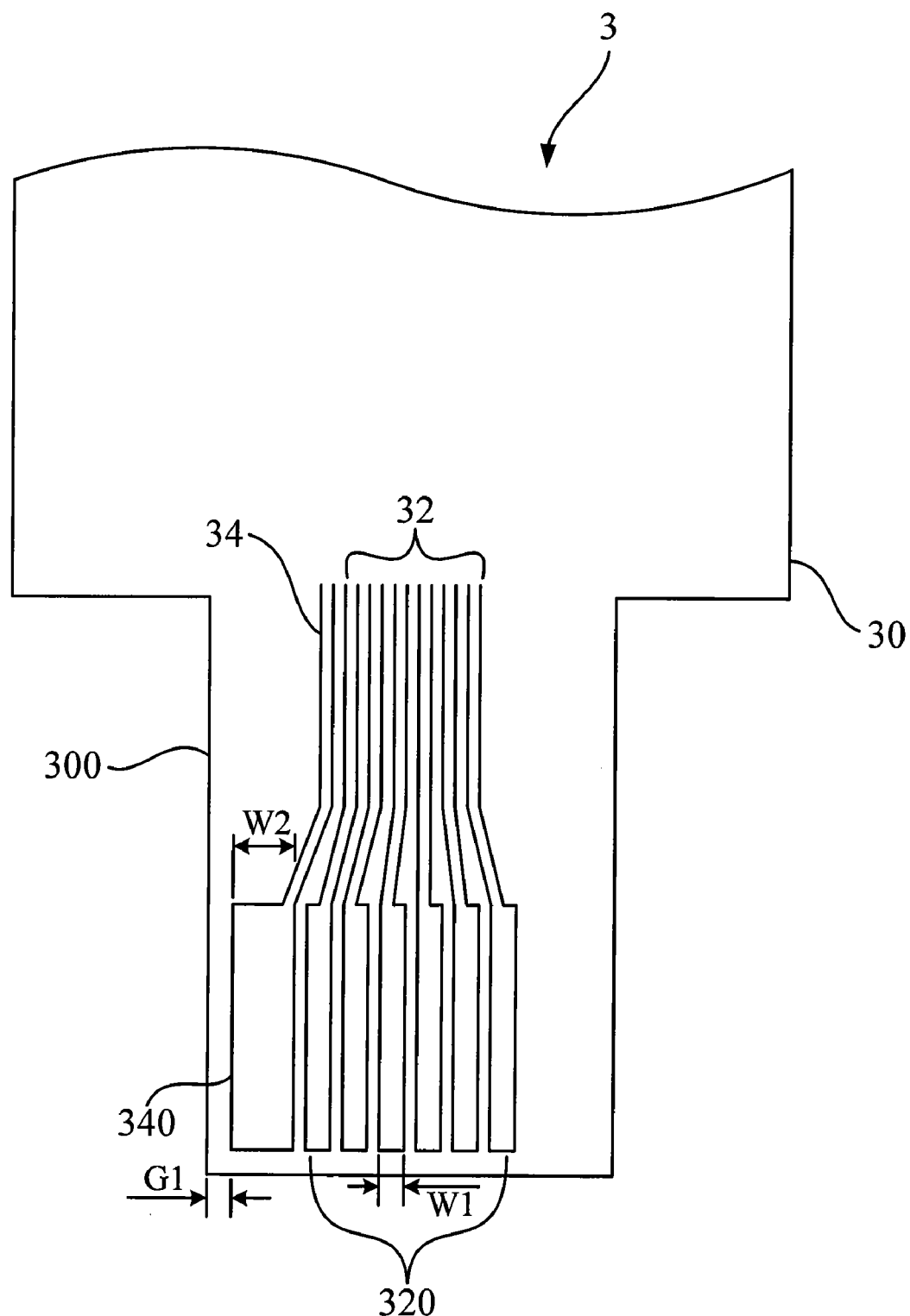
FIG. 2 is a schematic diagram illustrating a membrane circuit board according to an embodiment of the invention.

Please refer to FIG. 2. FIG. 2 is a schematic diagram illustrating a membrane circuit board 3 according to an embodiment of the invention. As shown in FIG. 2, the membrane circuit board 3 includes a substrate 30, a plurality of first signal pins 32 and a second signal pin 34. The first signal pins 32 and the second signal pin 34 are both disposed on the substrate 30.

The substrate 30 has a first edge 300. Each first signal pin 32 has a first terminal 320 respectively. The second signal pin 34 has a second terminal 340. The second terminal 340 is located between those first terminals 320 and the first edge 300.

In practical applications, the membrane circuit board 3 is usually a multi-layer structure. In general, the membrane circuit board 3 has layers including an upper membrane layer, a lower membrane layer and an insulation layer between them. There are some symmetrical or corresponding circuits laid on the upper and lower membrane layers respectively. When the upper membrane layer is pressed down to contact with the lower membrane layer, a corresponding electronic signal (e.g. conducting current) is generated at the contact point. Accordingly, the membrane circuit board 3 can be widely applied in an input device, such as keyboard. In this embodiment, the substrate 30 can be an insulation layer. The first signal pins 32 and the second signal pin 34 can be disposed on one side of the substrate, but the invention is not limited to this. In other case, each of the signal pins (first signal pins 32 and second signal pin 34) can be formed by two parallel and symmetrical wirings, which are disposed on both sides of the substrate respectively. The symmetrical wiring structure is well known by a person in the art, so not to be disclosed in detail here.

As shown in FIG. 2, each first terminal 320 has an identical first width W1, and the second terminal 340 has a different second width W2. In this embodiment, the second width W2 is larger than the first width W1.

In this embodiment, the second signal pin 34 is the pin adjacent to the first edge 300 of the substrate 30 on the membrane circuit board 3. Therefore, the second terminal 340 is adjacent to the first edge 300 and the second terminal 340 has the larger width W2. The second signal pin 34 can be electrically connected to a power switch (not shown) for controlling the on/off state of an external electronic device (not shown).

Besides, there is a first gap G1 between the second terminal 340 and the first edge 300. The first gap G1 is designed to be equal to one standard tolerance. The standard tolerance is maximum allowable error distance, which is defined by component suppliers and buyers. The standard tolerance of metal pins at current production level is around 0.05 mm in general, but the invention is not limited to this.

To be noticed that, the second signal pin 34 on the membrane circuit board 3 of the invention has wider second terminal 340 compared to the first signal pins 32. Therefore, when the membrane circuit board 3 is linked to an external electronic device, the second signal pin 34 with wider terminal may provide a better connection. In this way, it may allow a higher error tolerance in the production process of the membrane circuit board. Besides, the first gap G1 between the second terminal 340 and the first edge 300 is quite small (usually no more than 0.05 mm). If there is a mismatch happened during the punching process, the second signal pin 34 will be cut or trimmed, such that the first gap G1 will disappear. In this case, the disappearance of the first gap can be identified by human eyes easily, such that the quality control of the membrane circuit board can be more effective. In this case, it provides a simple way to verify and find out abnormal second signal pin 34, which is usually used for electrically connected with some important component, such as the power switch.

Figure 3:
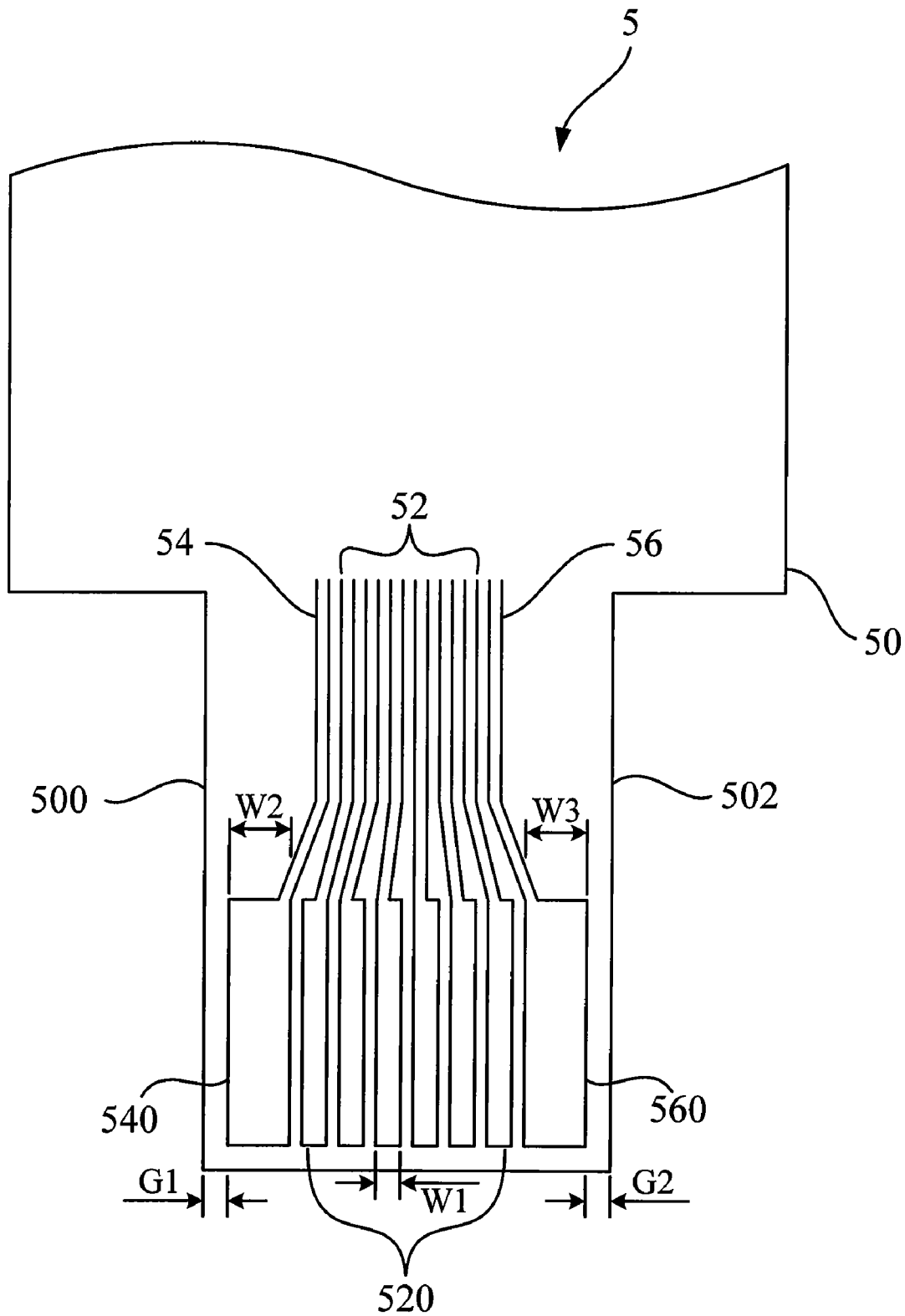
FIG. 3 is a schematic diagram illustrating a membrane circuit board according to another embodiment of the invention.

Please refer to FIG. 3. FIG. 3 is a schematic diagram illustrating a membrane circuit board 5 according to another embodiment of the invention. As shown in FIG. 3, the membrane circuit board 5 includes a substrate 50, a plurality of first signal pins 52, a second signal pin 54 and a third signal pin 56. The first signal pins 52, the second pin 54 and the third signal pin 56 are disposed on the substrate 50.

The substrate 50 has a first edge 500 and a second edge 502. The first edge 500 is opposite to the second edge 502. Each first signal pin 52 has a first terminal 520 respectively. The second signal pin 54 has a second terminal 540. The second terminal 540 is located between those first terminals 520 and the first edge 500. The third signal pin 56 has a third terminal 560. The third terminal 560 is located between those first terminals 520 and the second edge 500. In other word, the third thermal 560 is opposite to the second terminal 540.

In practical applications, the membrane 5 may also have symmetrical multi-layer structure, as mentioned in aforesaid paragraph.

As shown in FIG. 3, each first terminal 520 has an identical first width W1. The second terminal 540 has a second width W2. The third terminal 560 has a third width W3. In this embodiment, the second width W2 can be substantially equal to the third width W3. In the mean time, the second width W2 and the third width W3 are both larger than the first width W1.

In this embodiment, the second signal pin 54 and the third signal pin 56 can be electrically connected to a power switch (not shown) for controlling the on/off state of an external electronic device (not shown).

Besides, there is a first gap G1 between the second terminal 540 and the first edge 500, and there is a second gap G2 between the third terminal 560 and the second edge 502. The first gap G1 and the second gap G2 are both designed to be equal to one standard tolerance (e.g. around 0.05 mm), but the invention is not limited to this.

To be noticed that, the second and third signal pins on the membrane circuit board 5 of the invention has wider terminals (the second terminal 540 and the third terminal 560) compared to the first signal pins 52. Therefore, when the membrane circuit board 5 is linked to an external electronic device, the second signal pin 54 and the third signal pin 56 may ensure a better connection. In this way, it may allow a higher error tolerance in the production process of the membrane circuit board. Besides, the first gap G1 and the second gap G2 are both quite small (usually no more than 0.05 mm). If there is a mismatch happened during the punching process, the second signal pin 54 or the third signal pin 56 will be cut or trimmed, such that the first gap G1 or the second gap G2 will disappear. In this case, the disappearance of the gap can be identified by human eyes easily, such that the quality control of the membrane circuit board can be more effective. In this case, it provides a simple way to verify and find out abnormal signal pin, which is usually used for electrically connected with some important component, such as the power switch.

Accordingly, the invention discloses a membrane circuit board with high error tolerance and better quality control efficiency.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A membrane circuit board, comprising:
a substrate having a first edge;
a plurality of first signal pins disposed on the substrate, each of the first signal pins having a first terminal with a first width; and
a second signal pin disposed on the substrate, the second signal pin having a second terminal with a second width, the second terminal being disposed between the first edge and the first signal pins, the second width being larger than the first width, and the second signal pin being electrically connected to a power switch.

2. The membrane circuit board of claim 1, wherein there is a first gap between the second terminal and the first edge, and the first gap is equal to a first standard tolerance.

3. The membrane circuit board of claim 1, wherein the substrate having a second edge opposite to the first edge, the membrane circuit board further comprises a third signal pin disposed on the substrate, the third signal pin has a third terminal with a third width, the third terminal is disposed between the second edge and the first terminals, and the third width is larger than the first width.

4. The membrane circuit board of claim 3, wherein there is a second gap between the third terminal and the second edge, and the second gap is equal to a second standard tolerance.

5. The membrane circuit board of claim 3, wherein the second width is equal to the third width.

6. The membrane circuit board of claim 3, wherein the third signal pin is electrically connected to a power switch.

* * * * *